United States Patent
Toscani et al.

(10) Patent No.: US 10,505,379 B2
(45) Date of Patent: Dec. 10, 2019

(54) BATTERY JUMP STARTING CONNECTION DETECTION SYSTEM AND METHOD

(71) Applicants: Gerard M Toscani, Moorestown, NJ (US); Efrain Rodriguez, Bordentown, NJ (US)

(72) Inventors: Gerard M Toscani, Moorestown, NJ (US); Efrain Rodriguez, Bordentown, NJ (US)

(73) Assignee: Paris Business Products, Inc., Westampton, NJ (US)

( * ) Notice: Subject to any disclaimer, the term of this patent is extended or adjusted under 35 U.S.C. 154(b) by 0 days.

(21) Appl. No.: 16/123,138

(22) Filed: Sep. 6, 2018

(65) Prior Publication Data

US 2019/0081492 A1    Mar. 14, 2019

Related U.S. Application Data

(60) Provisional application No. 62/557,283, filed on Sep. 12, 2017.

(51) Int. Cl.
*H02J 7/00* (2006.01)
*H02J 1/00* (2006.01)
*H01M 2/30* (2006.01)

(52) U.S. Cl.
CPC ............ *H02J 7/0036* (2013.01); *H02J 7/008* (2013.01); *H02J 7/0054* (2013.01); *H02J 7/0088* (2013.01); *H01M 2/305* (2013.01); *H02J 2001/006* (2013.01)

(58) Field of Classification Search
CPC ........ H02J 7/0036; H02J 7/008; H02J 7/0088; H02J 7/0054; H02J 2001/006; H01M 2/305; H01M 10/48; G01R 31/006; G01R 27/02; G01R 31/045

USPC .......................................................... 320/104
See application file for complete search history.

(56) References Cited

U.S. PATENT DOCUMENTS

| | | | | |
|---|---|---|---|---|
| 4,829,255 A | * | 5/1989 | VanDerStuyf | G01R 31/045 324/538 |
| 4,843,326 A | * | 6/1989 | Smythe | G01R 31/006 324/133 |
| 6,906,523 B2 | * | 6/2005 | Bertness | G01R 31/389 324/426 |
| 7,626,394 B2 | * | 12/2009 | Kimura | G01R 31/389 324/427 |
| 8,129,996 B2 | * | 3/2012 | Iwane | G01R 31/389 324/427 |

(Continued)

*Primary Examiner* — M Baye Diao
(74) *Attorney, Agent, or Firm* — Stuart M. Goldstein

(57) ABSTRACT

A battery jump starting connection detection system and method assists in making the best connection to the vehicle battery by detecting the connection resistance to the battery. The connection resistance measurement is taken with the jump start battery isolated from the battery and involves placing a load of known resistance on the battery via the clamps and cabling, and measuring the voltage differential in loaded and unloaded states. The connection resistance is calculated in a main controller, given the loaded and unloaded voltages. As the user adjusts the jump start clamps on the battery terminals in order to get the best possible contact, the system measures the resistance and the results are presented on a display in a meaningful, easy-to-read format such as an LCD display. The user can thus optimize the connection while seeing the results of the optimization in real time.

7 Claims, 1 Drawing Sheet

(56) References Cited

U.S. PATENT DOCUMENTS

| | | | | |
|---|---|---|---|---|
| 8,469,724 | B1* | 6/2013 | Barnette | H01R 12/7088 |
| | | | | 439/86 |
| 9,428,071 | B2* | 8/2016 | Lee | B60W 20/00 |
| 10,141,755 | B2* | 11/2018 | Miller | H02J 7/0031 |
| 2013/0308679 | A1* | 11/2013 | Choi | H01M 10/482 |
| | | | | 374/152 |
| 2016/0093868 | A1* | 3/2016 | Ishikawa | H01M 2/305 |
| | | | | 429/61 |
| 2019/0001821 | A1* | 1/2019 | Gustafsson | B60L 3/0069 |

* cited by examiner

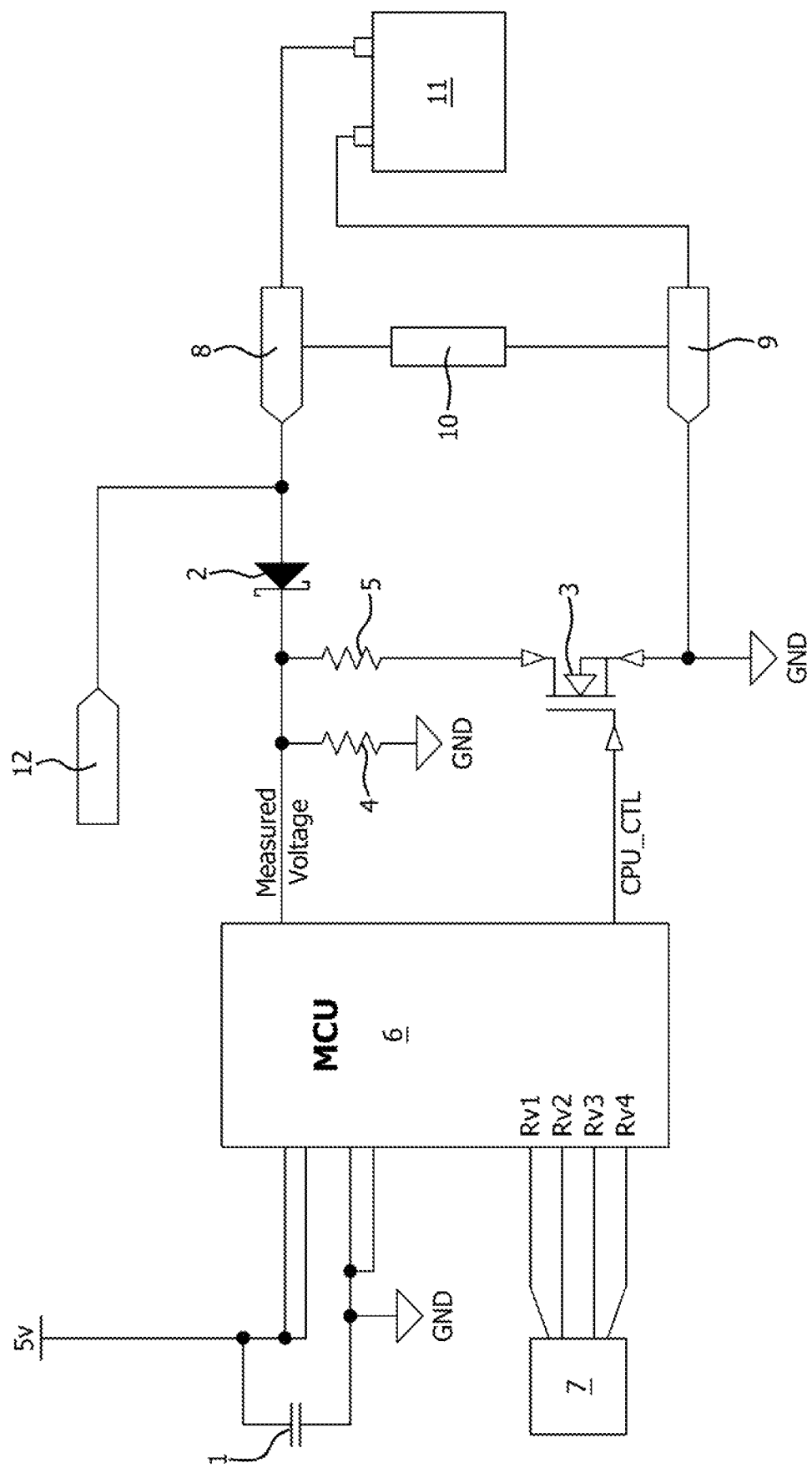

BATTERY JUMP STARTING CONNECTION DETECTION SYSTEM AND METHOD

RELATED APPLICATION

This application claims the benefit of Application Ser. No. 62/557,283, filed on Sep. 12, 2017.

BACKGROUND OF THE INVENTION

Internal Combustion engines historically have been started, or brought into an operating state, by a manual forced rotation of the crankshaft which engages the elements of the engine to begin its four stroke combustion cycle. Early engines accomplished this using a hand crank. More recently electric motors have been serving this purpose.

To develop sufficient torque to overcome angular inertia and attain initial rotation, significant currents are needed since the mass to be rotated is that of the engine's key components—not to mention that closed cylinders cause compressive opposition to the rotation of the crankshaft due to the motion of the pistons in the closed cylinders. A rule of thumb is that it takes one ampere for every cubic inch of displacement of engine size to successfully start an engine. This means that, for typical engines of today, it is not unusual for the starting process to require hundreds of amperes over a time span anywhere from 10 ms to over 1 second. Since automobiles use a relatively low voltage, e.g. 12V, developing and transporting these large currents depends on a low resistance pathways, since ohm's law states that:

$$\text{Current} = \frac{\text{Voltage}}{\text{Resistance}}$$

Devices like electric battery jump starters are typically attached to vehicle batteries simply and quickly by placing clamps onto the battery terminals, or on the positive terminal and the vehicle chassis. The quality of the connection (as measured by the resistivity of the connection) can determine the success of the jump-starting operation by either facilitating a parallel boost from the jump starter when the connection has sufficiently low resistance, or negating the benefit of the jump starter in the case of a poor connection (high resistance).

Knowing the resistance of the connection benefits the jump starting process by allowing the user to optimize the connection, thus maximizing the chances of a successful jump start.

SUMMARY OF THE INVENTION

The Battery Jump Starting Connection Detection System and Method of the present invention assists the user in making the best possible connection to the vehicle battery by detecting the connection resistance to the vehicle battery. The connection resistance measurement is taken with the jump start battery isolated from the vehicle battery (i.e. when the main current switch is off). The method involves placing a load of known resistance on the vehicle battery via the clamps and cabling, and measuring the voltage differential in the loaded and unloaded states. The connection resistance is calculated in a main controller processor, given the loaded and unloaded voltages, and the load resistance. Note that this value is the sum total of all resistances from the voltage source in the car battery, i.e. the battery internal impedance, the lugs, the wires, the clamps, etc. As the user adjusts the jump start clamps on the battery terminals in order to get the best possible contact, the system measures the resistance and the results are presented to the user on a display in a meaningful, easy-to-read format such as an LCD display graph. The user can thus optimize the connection while seeing the results of the optimization in real time.

The novel features which are considered as characteristic of the invention are set forth in particular in the appended claims. The invention, itself, however, both as to its design, construction and use, together with additional features and advantages thereof, are best understood upon review of the following detailed description with reference to the accompanying drawings.

BRIEF DESCRIPTION OF THE DRAWINGS

FIG. 1 is a circuitry schematic showing the main components of the Battery Jump Starting Connection Detection System.

DETAILED DESCRIPTION OF THE INVENTION

The present invention is a unique circuit which assists the user in making the best possible connection to the vehicle battery by detecting the connection resistance to the vehicle battery. The circuit components necessary to provide this capability are described below in detail and in combination with FIG. 1.

Component 1 is a small 0.1 uF capacitor which functions to provide instantaneous current to the main controller unit (MCU) 6. Capacitor 1 also bypasses high frequency noise present on the 5V power line.

Schottky diode 2 functions to allow voltage and current to pass from the vehicle battery via the starter clamps to the measurement circuit. Diode 2 also blocks any current and voltage from flowing backwards into the vehicle battery. Sensor circuits 12 assist diode 2 in this regard.

N-channel mosfet 3 is controlled by MCU 6 via the computer control (CPU_CTRL) signal. This signal turns the mosfet 3 "ON" and "OFF" like a switch. In the "OFF" state, mosfet 3 does not allow current to flow through low resistance load resistor 5 which is rated for 50 ohms and 20 watts of power. This allows the true vehicle battery voltage to be sampled by the internal analog to digital converter in MCU 6. This voltage value is stored as Vvehicle in MCU memory. MCU will then turn on mosfet 3 by raising the CPU_CTRL signal to 5V. In the "ON" state, current is allowed to flow through low resistance resistor 5, which places this resistor as a load across the vehicle battery. The Vehicle battery voltage is again sampled by the internal analog to digital converter in MCU. This value is stored as Vtest in MCU memory.

MCU 6 it is a small 8 bit processor with an internal analog to digital converter and internal memory. It runs an internal program to compute the resistance of the clamp connection and displays the result on a standard 8 bit graphical OLED or LCD display 7. The user can readjust the clamps or clean the connections to ultimately achieve an "Excellent" or "Good" connection indication on display 7.

The operation of the system of the present invention begins when positive and negative clamps 8 and 9 of jump starter battery 10 are connected to the terminals on battery 11. At this time MCU 6 starts the connection detection algorithm.

MCU 6 measures the vehicle battery voltage through clamps 8 and 9. Mosfet 3 is in the "OFF" state with no load placed on the clamps. This voltage is sampled ten times and an average is calculated and stored in memory as Vvehicle.

MCU 6 then turns the mosfet 3 "ON" by raising the CPU_CTRL signal to 5V. With mosfet 3 "ON", resistor 5 is connected as a load across the vehicle battery. This voltage is measured ten times and an average is calculated and stored in memory as Vtest.

Once Vvehicle and Vtest are calculated, MCU 6 turns mosfet 3 "OFF", removing resistor 5 from the circuit electrically. MCU 6 can now calculate the resistance of the clamp connection with this equation to calculate the real time clamp connection resistance or Rclamps: Rclamps=((Vvehicle*Rtest)/Vtest)−Rtest)). Offsets and constants are added for resistance of mosfet 3 and the forward voltage drop of Schottky diode 2.

The value calculated for Rclamps is compared to known, pre-set values stored in the internal memory of MCU 6. This allows the user to determine acceptable Rv's, clamp resistance connection values, for the electrical connection to the vehicle battery, a measure of connection quality. For example:

Excellent=Rv1=0.001Ω to 0.01Ω

Good=Rv2=0.01Ω to 0.05Ω

Fair=Rv3=0.05Ω to 0.09Ω

Poor=Rv4=>0.1Ω

MCU 6 maps the iterated readings of Rclamps and displays the relative connection quality on LCD graphical display 7 as a bargraph showing the range of resistance values. This provides a guide to the user to position clamps 8 and 9 on the battery terminals in order to obtain a low clamp resistance connection value and, as a result, the optimum electrical connection.

The algorithm loop expires after ten seconds of readings, and the connection quality is frozen onto LCD graphical display 7.

Certain novel features and components of this invention are disclosed in detail in order to make the invention clear in at least one form thereof. However, it is to be clearly understood that the invention as disclosed is not necessarily limited to the exact form and details as disclosed, since it is apparent that various modifications and changes may be made without departing from the spirit of the invention.

The invention claimed is:

1. A method of detecting the optimal electrical connection between a vehicle battery with battery terminals and a jump start battery with jump start battery clamps, said method comprising:
providing circuitry comprising a main controller unit, said main controller unit containing internal, pre-set resistance values ranging from high resistance values to low resistance values;
attaching the jump start battery clamps to the battery terminals of the vehicle battery;
measuring the voltage of the vehicle battery while in a non-load clamping condition;
storing the measured voltage in the main controller unit;
measuring the voltage of the vehicle battery while in a load clamping condition;
storing the load clamping condition voltage in the main controller unit;
comparing the non-load clamping condition voltage with the load clamping condition voltage;
calculating the real time clamp resistance connection between the vehicle battery and the jump start battery using the main controller unit and the stored non-load condition and load condition voltages;
comparing the clamp resistance connection with the pre-set resistance values contained in the main controller unit to obtain clamp resistance connection values;
displaying the clamp resistance connection values; and
adjusting the jump start battery clamps on the battery terminals to obtain low clamp resistance connection values.

2. The method as in claim 1 further comprising a component in the circuitry which provides instantaneous electric current to the main controller unit.

3. The method as in claim 2 wherein the component comprises a capacitor.

4. The method as in claim 1 further comprising a component in the circuitry which allows voltage and electric current to pass from the battery via the jump start clamps to the circuitry.

5. The method as in claim 4 wherein the component is a Schottky diode.

6. The method as in claim 1 further comprising a component in the circuitry which controls the flow of electric current through the circuitry.

7. The method as in claim 6 wherein the component is an N-channel mosfet.

* * * * *